US012785681B2

(12) United States Patent
Kim et al.

(10) Patent No.: US 12,785,681 B2
(45) Date of Patent: Nov. 3, 2026

(54) SEMICONDUCTOR DEVICE

(71) Applicant: Samsung Electronics Co., Ltd., Suwon-si (KR)

(72) Inventors: Kibum Kim, Suwon-si (KR); Seonkyeong Kim, Suwon-si (KR); Yongeun Cho, Suwon-si (KR); Eunhee Choi, Suwon-si (KR); Hayoung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 18 days.

(21) Appl. No.: 18/973,310

(22) Filed: Dec. 9, 2024

(65) Prior Publication Data

US 2025/0323642 A1 Oct. 16, 2025

(30) Foreign Application Priority Data

Apr. 12, 2024 (KR) ........................ 10-2024-0049209
Aug. 1, 2024 (KR) ........................ 10-2024-0102595

(51) Int. Cl.
*H03K 17/687* (2006.01)

(52) U.S. Cl.
CPC ..... *H03K 17/6872* (2013.01); *H03K 17/6874* (2013.01)

(58) Field of Classification Search
CPC ....................... H03K 17/6872; H03K 17/6874
See application file for complete search history.

(56) References Cited

U.S. PATENT DOCUMENTS

| | | | |
|---|---|---|---|
| 9,537,489 B1 | 1/2017 | Ko | |
| 9,722,607 B2 | 8/2017 | Lee | |
| 9,768,778 B2 | 9/2017 | Kwon et al. | |
| 10,205,441 B1 | 2/2019 | Abhishek et al. | |
| 11,855,535 B1 * | 12/2023 | Nguyen | H02M 1/08 |
| 2003/0189443 A1 | 10/2003 | Kunz et al. | |
| 2005/0212558 A1 | 9/2005 | Chung | |
| 2009/0243665 A1 * | 10/2009 | Kumar | H03K 19/00315 327/108 |
| 2015/0214946 A1 | 7/2015 | Van Der Goes et al. | |
| 2020/0178823 A1 * | 6/2020 | Lu | A61B 5/31 |
| 2023/0082252 A1 * | 3/2023 | Kim | H03K 19/018507 327/143 |

FOREIGN PATENT DOCUMENTS

KR 10-2320544 B1 11/2021

* cited by examiner

*Primary Examiner* — Sibin Chen
(74) *Attorney, Agent, or Firm* — Muir Patent Law, PLLC

(57) ABSTRACT

A semiconductor device includes a bias voltage generation circuit generating a plurality of bias voltages. The bias voltage generation circuit includes a plurality of transistors connected in series between a first power node supplying a first power voltage and a reference node supplying a reference voltage, lower than the first power voltage, a plurality of capacitors connected to some transistors among the plurality of transistors, wherein each of the plurality of capacitors is connected in parallel with a corresponding transistor of the some transistors, and a turn-on circuit configured to supply a turn-on voltage to a gate of a first transistor among the plurality of transistors. Each of the turn-on circuit and the first transistor is directly connected to the first power node. Each of the plurality of transistors has a gate and a drain, electrically connected to each other.

20 Claims, 16 Drawing Sheets

SEMICONDUCTOR DEVICE

CROSS-REFERENCE TO RELATED APPLICATION(S)

This application claims benefit of priority to Korean Patent Application No. 10-2024-0049209 filed on Apr. 12, 2024 and Korean Patent Application No. 10-2024-0102595 filed on Aug. 1, 2024 in the Korean Intellectual Property Office, the disclosures of which are incorporated herein by reference in its entirety.

BACKGROUND

The present inventive concept relates to a semiconductor device.

A semiconductor device may include a plurality of semiconductor elements, and may include circuits that operate using different power voltages. Recently, in order to increase a degree of integration, research is actively being conducted to reduce a size of an element included in a semiconductor device, and a magnitude of voltage that can be applied to individual elements is also decreasing. However, despite the decrease in magnitude of voltage that can be applied to the elements, it is desirable to implement a circuit that operates with a power voltage having a higher level than the voltage that can be applied to the elements (i.e., a breakdown voltage of transistors of the circuit). It may be relatively easy to implement a circuit that may operate with a high power voltage by arranging some elements that can withstand relatively high voltages (i.e., breakdown voltages of the elements are greater than the high power voltage), but in this case, a degree of integration may decrease or the number of process operations may increase due to fabrication of transistors having at least two different breakdown voltages.

SUMMARY

An aspect of the present inventive concept is to provide a semiconductor device having an improved degree of integration, improved leakage characteristics (e.g., reduced amount of leakage current) by implementing a circuit that operates at a power voltage, higher than a limited voltage that can be applied to individual elements, using only the individual elements, and also implementing a bias circuit supplying a bias voltage to some of the individual elements included in a circuit, using the individual elements.

According to an aspect of the present disclosure, a semiconductor device includes a bias voltage generation circuit generating a plurality of bias voltages. The bias voltage generation circuit includes a plurality of transistors connected in series between a first power node supplying a first power voltage and a reference node supplying a reference voltage, lower than the first power voltage, a plurality of capacitors connected to some transistors among the plurality of transistors, wherein each of the plurality of capacitors is connected in parallel with a corresponding transistor of the some transistors, and a turn-on circuit configured to supply a turn-on voltage to a gate of a first transistor among the plurality of transistors. Each of the turn-on circuit and the first transistor is directly connected to the first power node. Each of the plurality of transistors has a gate and a drain, electrically connected to each other.

According to an aspect of the present disclosure, a semiconductor device includes a bias circuit configured to generate a first bias voltage and a second bias voltage, and a target circuit connected to a first power node and a reference node and configured to operate by receiving a first power voltage supplied from the first power node and a reference voltage supplied from the reference node. The reference voltage is smaller than the first power voltage. The target circuit includes a plurality of transistors of which at least one transistor is directly connected to the first power node and at least one transistor is directly connected to the reference node, and a plurality of tolerant transistors connected to the bias circuit. Each of the plurality of tolerant transistors is configured to receive a corresponding one of the first bias voltage and the second bias voltage. The first bias voltage and the second bias voltage are smaller than the first power voltage and greater than the reference voltage. The bias circuit includes a plurality of diode-connected transistors connected in series between the first power node and the reference node. The first bias voltage is outputted from a first node between two adjacent diode-connected transistors among the plurality of diode-connected transistors, and the second bias voltage, smaller than the first bias voltage, is outputted from a second node between another two adjacent diode-connected transistors among the plurality of diode-connected transistors. A breakdown voltage of each of the plurality of diode-connected transistors is equal to a breakdown voltage of each of the plurality of transistors.

According to an aspect of the present disclosure, a semiconductor device includes a target circuit including a plurality of elements, and connected to a first power node supplying a first power voltage and a reference node supplying a reference voltage, lower than the first power voltage, and a bias circuit configured to output a first bias voltage and a second bias voltage, input to a gate of each of some elements among the plurality of elements. The bias circuit includes a plurality of transistors connected between the first power node and the reference node, and a plurality of capacitors connected to some transistors, among the plurality of transistors, connected in sequence from the reference node.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments will be described with reference to the attached drawings.

Figure 1:
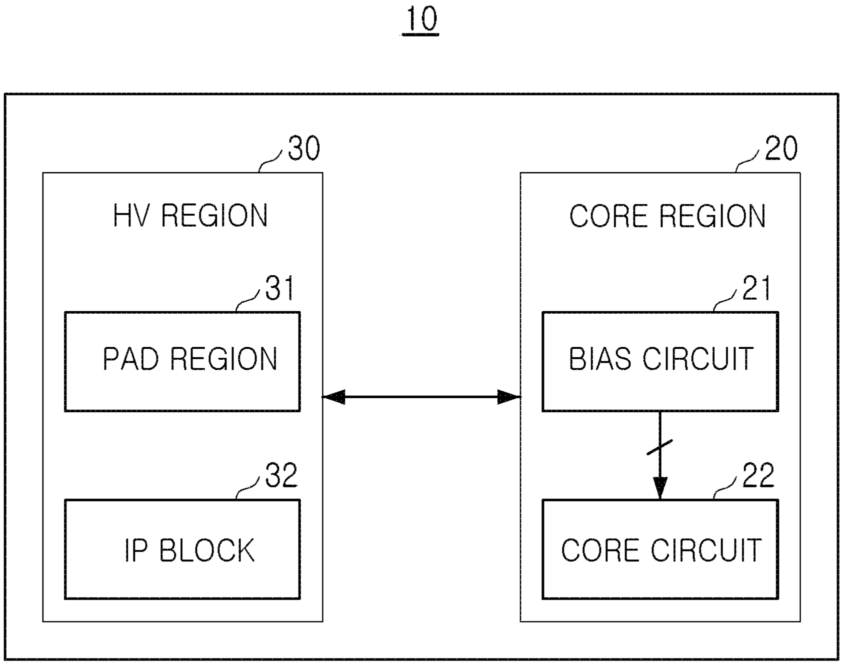
FIG. 1 is a block diagram illustrating a semiconductor device according to an embodiment.

FIG. 1 is a block diagram illustrating a semiconductor device according to an embodiment.

Referring to FIG. 1, a semiconductor device 10 according to an embodiment may include a core region 20 and an HV region 30. Elements included in the core region 20 and elements included in the HV region 30 may have different specifications of transistors (e.g., breakdown voltages of transistors). For example, a maximum voltage that can be applied to each of the elements included in the core region 20 may be lower than a maximum voltage that can be applied to each of the elements included in the HV region 30. For example, a maximum voltage that each of the elements included in the core region 20 can withstand may be defined as a first maximum voltage, and a maximum voltage that each of the elements included in the HV region 30 can withstand may be defined as a second maximum voltage, greater than the first maximum voltage. For example, the maximum voltage that can be applied to a transistor without causing permanent damage such as junction breakdown and gate oxide breakdown is referred to as a breakdown voltage, which is a critical specification listed in a transistor datasheet. A voltage exceeding a breakdown voltage of a transistor may permanently damage the transistor. The term elements may refer to metal-oxide-semiconductor (MOS) transistors.

A pad region 31, an intellectual property (IP) block 32, and the like may be arranged in the HV region 30. The pad region 31 may include a plurality of pads exposed externally and electrically connected to a different semiconductor device, a different substrate, and/or the like, an electrostatic discharge (ESD) protection circuit connected to the plurality of pads, and the like. The IP block 32 may be a functional block implemented to execute a specific function. The pad region 31 and the IP block 32 may be implemented by elements that can be applied up to the second maximum voltage.

Circuits included in the core region 20 may be implemented by elements having a first maximum voltage in which a maximum voltage that can be applied is relatively small. The maximum voltage that can be applied may mean a maximum value of a voltage that can be applied between a source and a drain, between a gate and the source, or between the gate and the drain without damaging an element, which may be a transistor. The core region 20 may include standard cells defined as elements in which a maximum voltage that can be applied is relatively small, and various core circuits 22 may be implemented in the core region 20 by the standard cells.

According to an embodiment, a core circuit 22 that operates at a power voltage, greater than a first maximum voltage, may be disposed in the core region 20. In this case, the core circuit 22 that operates at a power voltage greater than the first maximum voltage may be implemented by placing some elements that can withstand a voltage, greater than the first maximum voltage, for example, a second maximum voltage, in the core region 20. In the above method, elements having different specifications (e.g., different breakdown voltages) are formed in the core region 20, which may increase the number of process operations. In addition, in a case in which an element having a gate-all-around (GAA) structure, which has been recently proposed to improve integration of the semiconductor device 10, is applied to the core region 20, there may be a limit to increasing a thickness of a gate insulating layer to increase the operation speed of the semiconductor device 10, making it impossible to form an element that can withstand a maximum voltage, greater than the first maximum voltage in the core region 20. For example, when a voltage greater than the breakdown voltage of a transistor of the core region 20 is applied thereto, the transistor may have permanent damage such as junction breakdown and gate insulating layer breakdown, thereby causing malfunction of the semiconductor device 10.

A tolerant element may be included in the core circuit 22 that operates at a power voltage greater than the first maximum voltage, to be implemented only with elements that can be applied up to the first maximum voltage. In this case, a bias circuit 21 (i.e., a bias voltage generation circuit) supplying a predetermined bias voltage to the tolerant element may be desirable. The bias circuit 21 may stably output the bias voltage. In some embodiments, the bias circuit 21 may be implemented with a voltage divider including resistive elements. When the bias circuit 21 is designed as the voltage divider including the resistive elements, the bias circuit 21 is disposed outside the core region 20, and in this case, a transmission path of the bias voltage becomes longer to increase a leakage component (i.e., a leakage current) and a resistance component, and may lower a degree of integration of the semiconductor device 10.

In an embodiment, as illustrated in FIG. 1, the bias circuit 21 may be disposed in the core region 20. The bias circuit 21, like the core circuit 22, may be implemented by elements that can be applied up to the first maximum voltage. Therefore, the bias circuit 21 supplying a bias voltage to the core circuit 22 that operates at high voltage may be designed, based on a standard cell like the core circuit 22, to be implemented in the core region 20, may reduce leakage between the bias circuit 21 and the core circuit 22, and may improve a degree of integration of the semiconductor device 10.

Figure 2A:
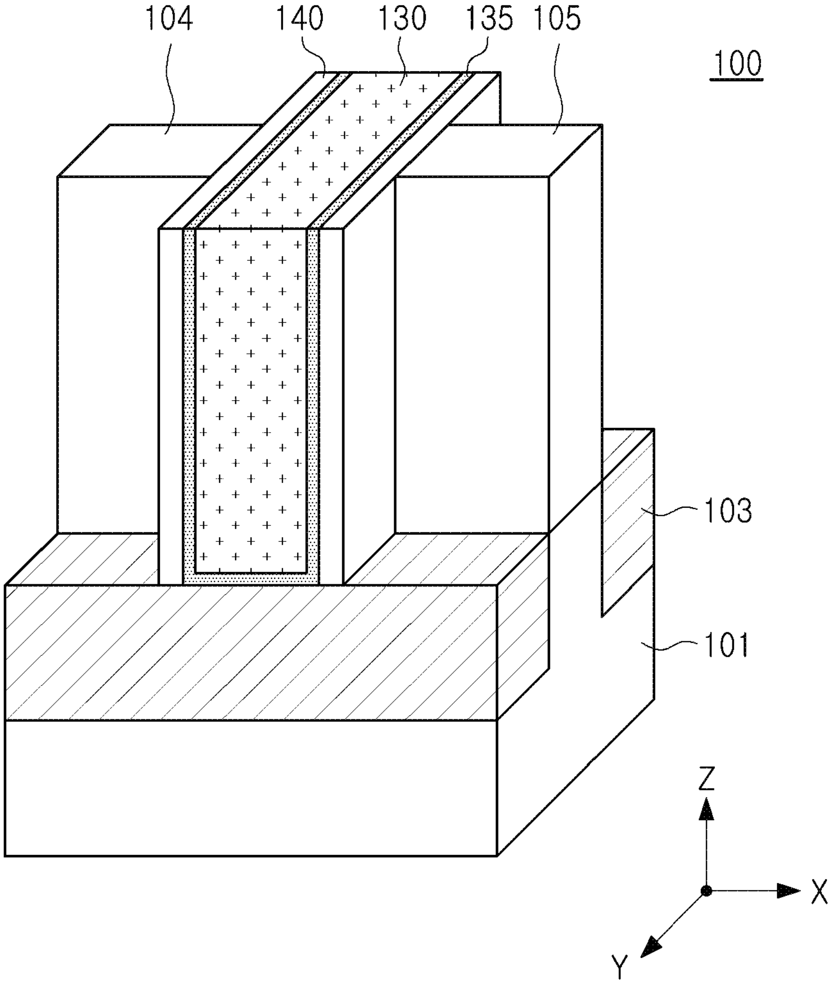
FIGS. 2A and 2B are views illustrating elements included in a semiconductor device according to an embodiment.
Figure 2B:
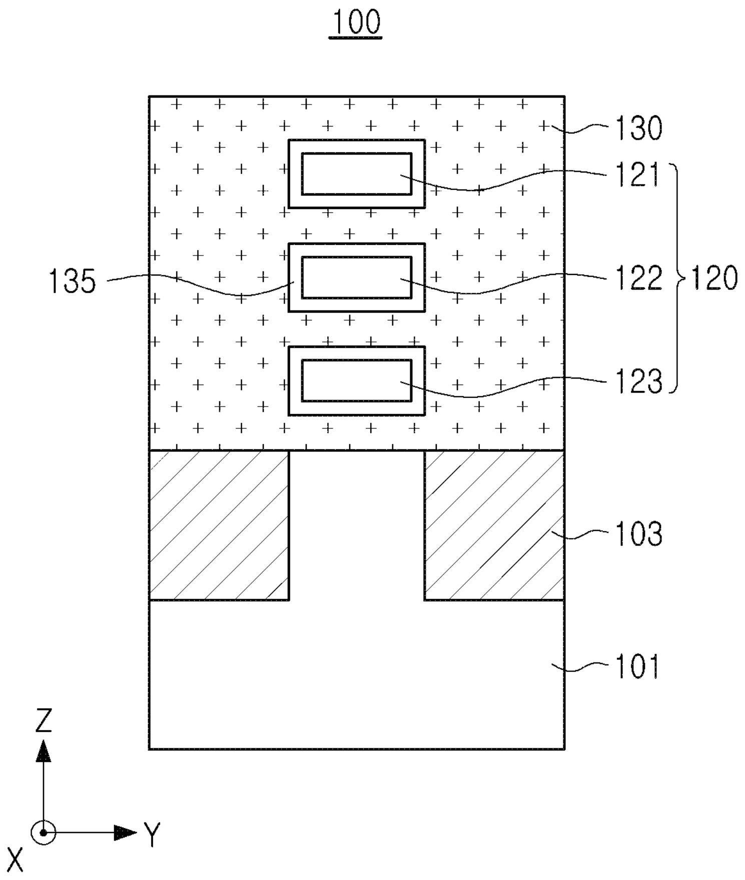

FIGS. 2A and 2B are views illustrating elements included in a semiconductor device according to an embodiment.

As described above, a semiconductor device may include an HV region, a core region, and the like, and an element 100 described with reference to FIGS. 2A and 2B may be an element disposed in the core region. In an embodiment, the element 100 disposed in the core region may have a GAA structure.

Referring to FIGS. 2A and 2B, an element 100 may be formed on a substrate 101, and a substrate insulating layer 103 may be formed on the substrate 101. The substrate 101 may include a vertical region extending in a first direction (Z-axis direction) between the substrate insulating layers 103, and active regions 104 and 105 and a gate electrode layer 130 may be disposed on the vertical region of the substrate 101. The active regions 104 and 105 may provide a source region and a drain region of the element 100, and may be arranged in a second direction (X-axis direction) parallel to an upper surface of the substrate 101, and may extend in the first direction. In some embodiments, the substrate insulating layer 103 may serve as an isolation layer defining the active regions 104 and 105.

The gate electrode layer 130 may be disposed between the active regions 104 and 105 in the second direction, and may extend in the first direction and a third direction (Y-axis direction). A gate insulating layer 135 and a spacer 140 may be disposed between the gate electrode layer 130 and the active regions 104 and 105.

A plurality of channel regions 121 to 123 (120) may be disposed between the active regions 104 and 105 in the second direction. Referring to FIG. 2B, the plurality of channel regions 120 may extend in the second direction, and may be connected to the active regions 104 and 105 on opposite sides, and the plurality of channel regions 120 may be separated from each other in the first direction. The plurality of channel regions 120 may be surrounded by the gate electrode layer 130 in the first direction and the third direction, and the gate insulating layer 135 may also be disposed between the plurality of channel regions 120 and the gate electrode layer 130.

As illustrated in FIGS. 2A and 2B, core circuits disposed in a core region of a semiconductor device may be implemented as the element 100 having a GAA structure, a degree of integration of the semiconductor device may be improved. as a size of the element 100 decreases, a maximum voltage that can be applied to the element, for example, the element can withstand, may decrease, and therefore, a method for implementing a core circuit that operates at a power voltage, greater than the maximum voltage that the element 100 can withstand may be required.

For example, by increasing the maximum voltage that can be applied to the element 100, a core circuit that operates at a high power voltage may be implemented. Similar to the above description, the maximum voltage that can be applied to the element 100 may mean a maximum value of a voltage that can be applied between a source and a drain, between a gate and the source, or between the gate and the drain of the element 100. The maximum voltage that can be applied to the element 100 may increase by structural changes such as an increase in thickness of the gate insulating layer 135. In the element 100 having the GAA structure, as illustrated in FIGS. 2A and 2B, it may be difficult to increase a thickness of the gate insulating layer 135, and thus it is impossible to increase a maximum voltage in which the element 100 can withstand.

In an embodiment, a core circuit that operates at a power voltage, greater than a maximum voltage in which the element 100 can withstand, may be implemented using only one type of element 100 having the same thickness of the gate insulating layer 135. To this end, some of the elements 100 included in the core circuit may operate as a tolerant element receiving a predetermined bias voltage.

To secure operational stability of the core circuit, a bias voltage may be stably supplied to the core circuit. In an embodiment, a bias circuit supplying a bias voltage to the tolerant element may be implemented by using the element 100 such as the element 100 included in the core circuit. For example, a thickness of a gate electrode layer of the element 100 included in the core circuit may be equal to a thickness of a gate electrode layer of the element included in the bias circuit. Therefore, the bias circuit supplying the bias voltage to the tolerant element may be designed, based on a standard cell such as the core circuit including the tolerant element, to be implemented in the core region together with the core circuit, may reduce leakage between the bias circuit and the core circuit, and may improve a degree of integration of the semiconductor device.

Figure 3A:
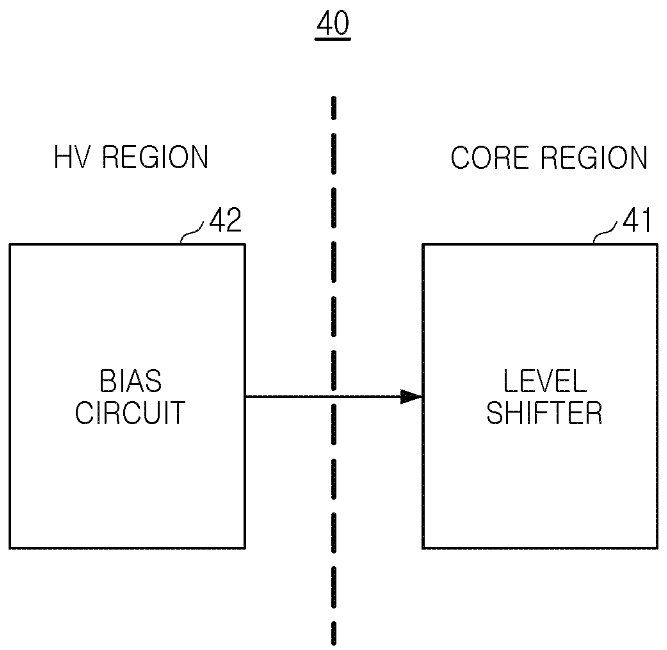
FIGS. 3A and 3B are views illustrating a semiconductor device according to an embodiment.
Figure 3B:
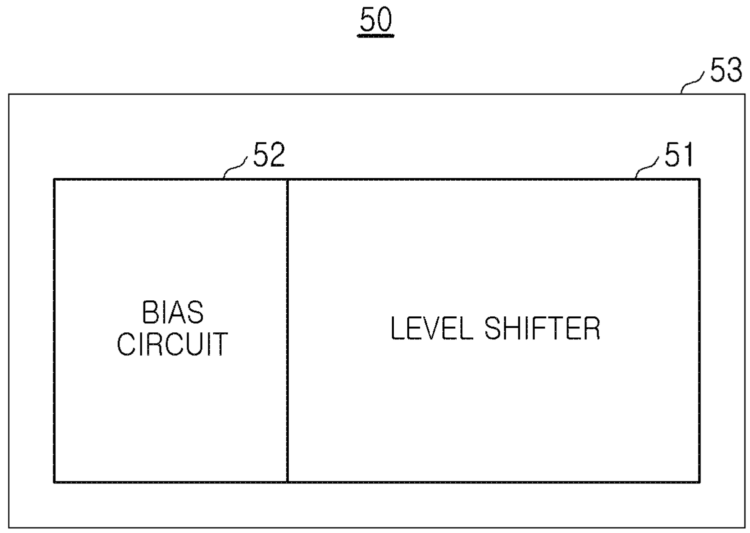

FIGS. 3A and 3B are views illustrating a semiconductor device according to an embodiment.

FIG. 3A is a view illustrating a semiconductor device 40 according to a comparative example, and FIG. 3B is a view illustrating a semiconductor device 50 according to the present disclosure. In each of the examples described with reference to FIGS. 3A and 3B, a level shifter (41 and 51) may include at least one tolerant element receiving a bias voltage output by a bias circuit (42 and 52). A power voltage supplied for an operation of the level shifter (41 and 51) may be greater than a maximum voltage that each of elements included in the level shifter (41 and 51) can withstand.

First, referring to FIG. 3A, in a semiconductor device 40 according to a comparative example, a level shifter 41 may be disposed in a core region, and a bias circuit 42 may be disposed in an HV region. The bias circuit 42 does not have to be implemented with the same elements as those included in the level shifter 41, and may be implemented with a resistance divider (i.e., a voltage divider) including, for example, a plurality of resistance elements connected with each other in series. In the comparative example illustrated in FIG. 3A, the bias circuit 42 may be disposed in the HV region, and a transmission path of a bias voltage output by the bias circuit 42 may be formed using a metal interconnection to transmit the bias voltage to the level shifter 41. Therefore, leakage and/or voltage drop may occur in the transmission path of the bias voltage, and the bias voltage may not be stably maintained in a tolerant element of the level shifter 41.

Referring to FIG. 3B, in a semiconductor device 50 according to the present disclosure, a bias circuit 52 may be disposed adjacent to a core circuit such as a level shifter 51 including a tolerant element. The bias circuit 52 may be designed based on a standard cell such as the core circuit of the level shifter 51, and may be disposed adjacent to the core circuit. In an embodiment, the core circuit of the level shifter 51 and the bias circuit 52 may be provided as one circuit. According to an embodiment, the core circuit of the level shifter 51 and the bias circuit 52 may be provided in a form of one macro cell together with the bias circuit 52, and may be finished with a plurality of finishing cells 53 to form a macro cell. According to an embodiment, the core circuit of the level shifter 51 and the bias circuit 52 may be provided as one standard cell. In an embodiment, a standard cell may correspond to a basic logic cell used to build digital circuits, and a core cell may correspond to a pre-designed functional block that performs a specific task in a semiconductor device.

As illustrated in FIG. 3B, the plurality of finishing cells 53 may be disposed around the level shifter 51 and the bias circuit 52, disposed adjacent to each other. In this manner, the core circuit including the tolerant element that requires supply of a bias voltage may be disposed adjacent to the bias circuit 52, and the plurality of finishing cells 53 may be disposed therearound to finish it as a macro cell type, a transmission path of the bias voltage may be shortened, and a degree of integration of a semiconductor device may be improved.

In an embodiment, a target circuit such as the level shifter 51 that operates by receiving a relatively high power voltage may include at least one tolerant element, and the tolerant element may receive the bias voltage output by the bias circuit 52. As illustrated in FIG. 3B, the bias circuit 52 and the target circuit may be disposed in the same core region, and the transmission path of the bias voltage may be shortened to stably drive the tolerant element, while simplifying an interconnection design for transmitting the bias voltage to improve a degree of integration of the semiconductor device.

Figure 4:
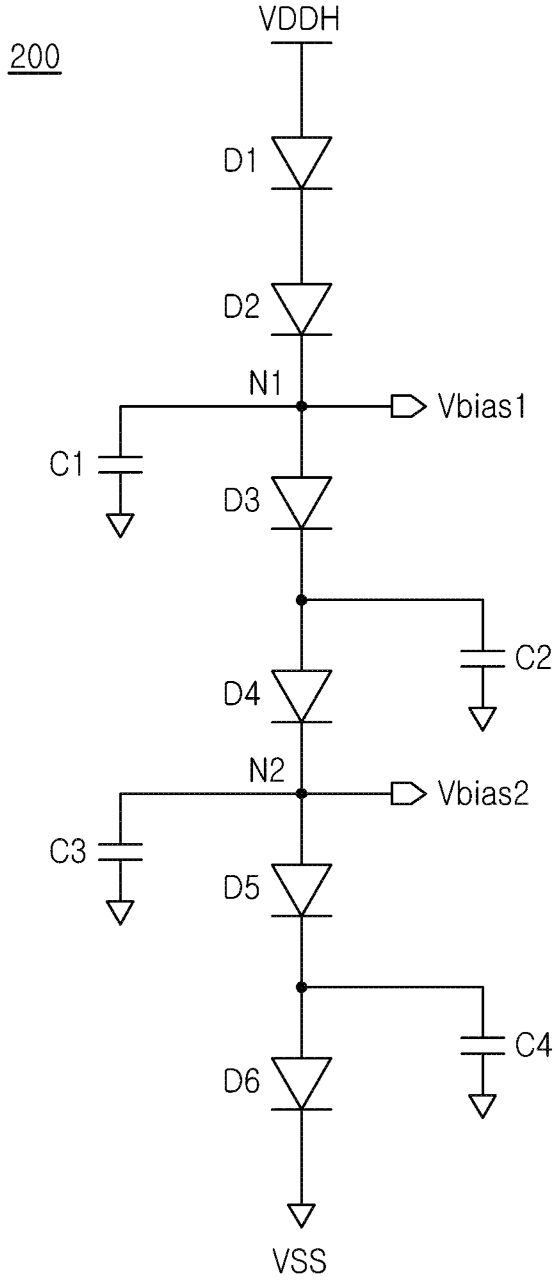
FIGS. 4 and 5 are views illustrating a bias circuit included in a semiconductor device according to an embodiment.
Figure 5:
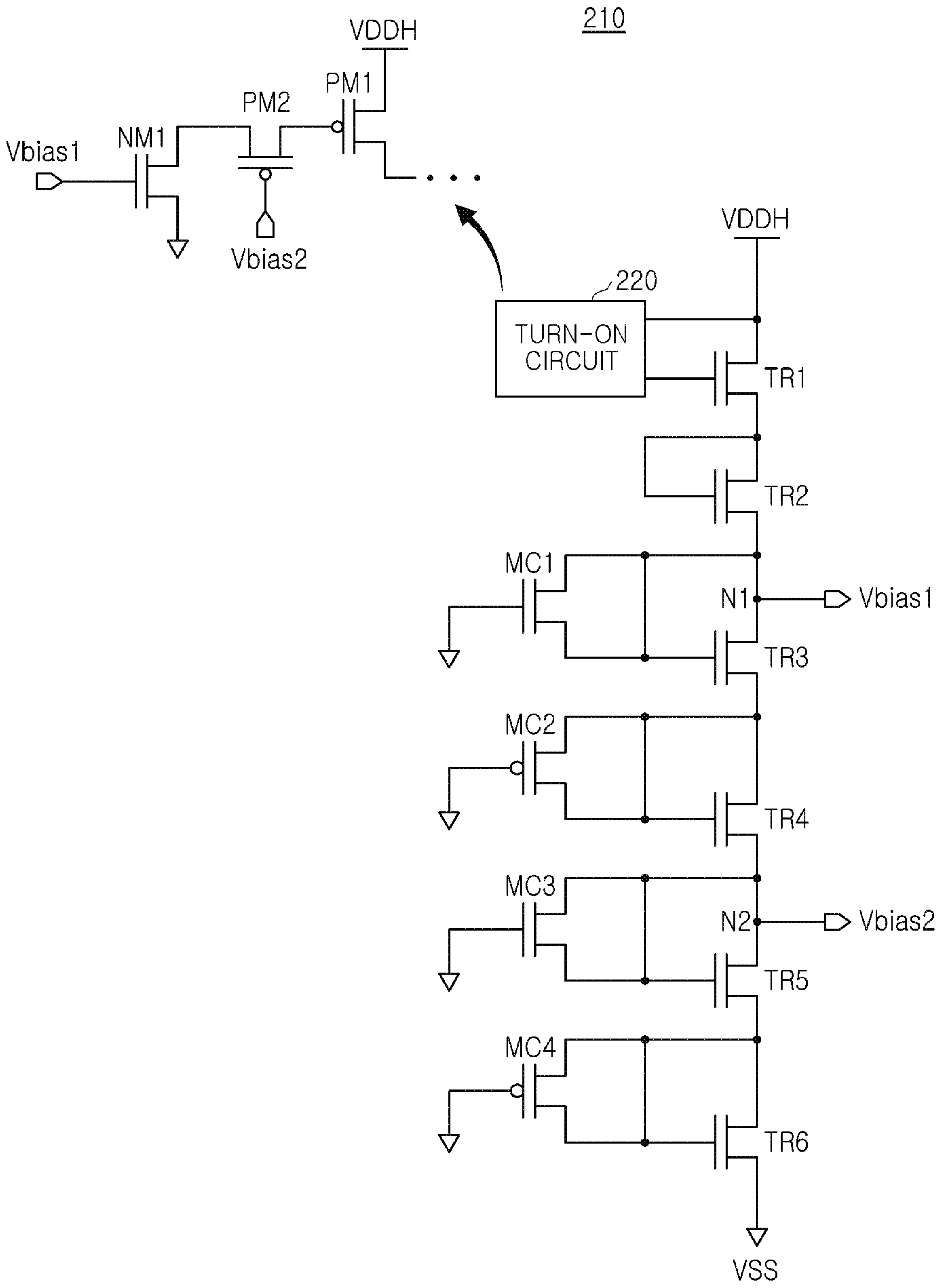

FIGS. 4 and 5 are views illustrating a bias circuit included in a semiconductor device according to an embodiment.

Referring to FIG. 4, a bias circuit 200 according to an embodiment may include a plurality of diodes D1 to D6 connected in series between a first power node supplying a first power voltage VDDH and a reference node supplying a reference voltage VSS (e.g., the ground voltage), lower than the first power voltage VDDH. Capacitors C1 to C4 may be connected to nodes between some diodes D3 to D6 among the plurality of diodes D1 to D6. The capacitors C1 to C4 may be connected to reduce voltage fluctuation of each of the nodes between the some diodes D2 to D6.

Referring to FIG. 4, a first bias voltage Vbias1 may be output from a first node N1 between a second diode D2 and a third diode D3, and a second bias voltage Vbias2 may be output from a second node N2 between a fourth diode D4 and a fifth diode D5. The first bias voltage Vbias1 may be greater than the second bias voltage Vbias2.

The first bias voltage Vbias1 and the second bias voltage Vbias2 may be input to a core circuit including elements that can withstand a maximum voltage, smaller than a voltage difference between the first power voltage VDDH and the reference voltage VSS. In an embodiment, some of the elements included in the core circuit operate as tolerant elements, and the first bias voltage Vbias1 or the second bias voltage Vbias2 may be input to the tolerant elements.

Each of the plurality of diodes D1 to D6 and the plurality of capacitors C1 to C4 for implementing the bias circuit 200 may be implemented by a MOS transistor, such as each of the elements of the core circuit that operate using the first bias voltage Vbias1 and the second bias voltage Vbias2. Therefore, the bias circuit 200 may be designed, based on a standard cell such as the core circuit, and the core circuit and the bias circuit 200 may be disposed adjacent to each other, and may be finished with a plurality of finishing cells. The bias circuit 200 may be designed and disposed in this manner, leakage between the bias circuit 200 and the core circuit may be reduced, and a degree of integration of a semiconductor device may be improved.

Referring to FIG. 5, a bias circuit 210 may include a plurality of transistors TR1 to TR6, a plurality of capacitors MC1 to MC4, a turn-on circuit 220, and the like. Each of the plurality of transistors TR1 to TR6 (i.e., diode-connected transistors TR1 to TR6) may have a gate and a drain connected to each other to form a diode-connected transistor, and may function as a diode. Each of the plurality of capacitors MC1 to MC4 may be a metal-oxide-semiconductor (MOS) capacitor implemented as a transistor formed in the same manufacturing process as the plurality of transistors TR1 to TR6. For example, when each of the plurality of transistors TR1 to TR6 has a GAA structure, the transistor providing the MOS capacitor may also have the GAA structure. In the transistor providing the MOS capacitor, a source and a drain may be connected to each other to make the transistor serve as the MOS capacitor, and a gate may be connected to a reference node supplying the reference voltage VSS.

In an embodiment illustrated in FIG. 5, the number of the plurality of capacitors MC1 to MC4 may be less than the number of the plurality of transistors TR1 to TR6. For example, the plurality of capacitors MC1 to MC4 may match third to sixth transistors TR3 to TR6, and one of the plurality of capacitors MC1 to MC4 may be connected in parallel with one transistor to be matched, among the third to sixth transistors TR3 to TR6.

In an embodiment, the plurality of capacitors MC1 to MC4 may be connected only to some transistors (TR3 to TR6) sequentially connected from the reference node. The number of some transistors (TR3 to TR6) to which the plurality of capacitors MC1 to MC4 are connected may be determined according to a level of a first bias voltage Vbias1 that may be relatively larger among bias voltages Vbias1 and Vbias2 to be output.

The plurality of capacitors MC1 to MC4 may be connected to the third to sixth transistors TR3 to TR6 to stabilize a voltage of a first node N1 and a voltage of a second node N2, to stably maintain a level of the first bias voltage Vbias1 and a level of the second bias voltage Vbias2. In an embodiment, each of the plurality of capacitors MC1 to MC4 may be implemented by a transistor including a plurality of gate structures such that the level of the first bias voltage Vbias1 and the level of the second bias voltage Vbias2 are sufficiently stabilized. Each of the plurality of capacitors MC1 to MC4 may be implemented by the transistor including the plurality of gate structures vertically stacked on each other as shown in FIG. 2B, to sufficiently secure capacitance of each of the plurality of capacitors MC1 to MC4, and to stably output the first bias voltage Vbias1 and the second bias voltage Vbias2.

Portions of the plurality of capacitors MC1 to MC4 may be implemented as N-type metal-oxide-semiconductor (NMOS) transistors, and remaining portions thereof may be implemented as P-type metal-oxide-semiconductor (PMOS) transistors. It may be advantageous in terms of a manufacturing process to form a PMOS transistor and an NMOS transistor as a pair (i.e., a complementary MOS (CMOS) transistor), and considering this, capacitors (MC1 and MC3) implemented as NMOS transistors and capacitors (MC2 and MC4) implemented as PMOS transistors may be disposed alternately, as illustrated in FIG. 5. For example, the plurality of capacitors MC1 to MC4 may include a first group of NMOS capacitors (e.g., the first and third capacitors MC1 and MC3) and a second group of PMOS capacitors (e.g., the second and fourth capacitors MC2 and MC4). Each of the first group of NMOS capacitors and each of the second group of PMOS capacitors are alternately arranged between the first power node supplying the first power voltage VDDH and the second power node supplying the second power voltage VSS.

In an embodiment illustrated in FIG. 5, a drain and a gate of a first transistor TR1 may not be directly connected to each other, but may be connected to the turn-on circuit 220. A first power node supplying the first power voltage VDDH may be connected to the drain of the first transistor TR1. In a similar manner to other transistors (TR2 to TR6), when the gate of the first transistor TR1 is directly connected to the drain of the first transistor TR1, the gate of the first transistor TR1 may be electrically vulnerable due to being directly connected to a first power node.

In an embodiment, the gate and the drain of the first transistor TR1 may be electrically connected to each other through the turn-on circuit 220 implemented as a TIE-HI circuit. Referring to FIG. 5, the turn-on circuit 220 may include a first PMOS transistor PM1, a second PMOS transistor PM2, and a first NMOS transistor NM1.

The first PMOS transistor PM1 may be connected to the first power node and the gate of the first transistor TR1. The first NMOS transistor NM1 may be connected to the reference node, and the first bias voltage Vbias1 may be input to a gate of the first NMOS transistor NM1. The second PMOS transistor PM2 may be connected between a gate of the first PMOS transistor PM1 and the first NMOS transistor NM1, and the second bias voltage Vbias2 may be input to a gate of the second PMOS transistor PM2.

Each of the nodes of the bias circuit 210 may be initially floating. When the bias circuit 210 starts operating, a voltage of each of the nodes may change due to leakage components occurring in each channel of the plurality of transistors TR1 to TR6. For example, the first bias voltage Vbias1 may be output from the first node N1, and the second bias voltage Vbias2 may be output from the second node N2.

In the turn-on circuit 220, the first NMOS transistor NM1 may be turned on by the first bias voltage Vbias1, and the same voltage as the first bias voltage Vbias1 may be applied to the gate of the first PMOS transistor PM1 by the second PMOS transistor PM2. Therefore, the first PMOS transistor PM1 may be turned on, and the first power voltage VDDH may be applied to the gate of the first transistor TR1 by the first PMOS transistor PM1, such that the first transistor TR1 may operate as a diode.

The first bias voltage Vbias1 and the second bias voltage Vbias2 output by the bias circuit 210 may be input to a target circuit including a tolerant element that operates by the first bias voltage Vbias1 and the second bias voltage Vbias2. The target circuit may be one of core circuits disposed in a core region together with the bias circuit 210, and the target circuit and the bias circuit 210 may be disposed adjacent to each other to be provided in a form of one macro cell. For example, a plurality of finishing cells may be disposed around the target circuit and the bias circuit 210. According to an embodiment, the target circuit and the bias circuit 210 may be provided in a form of being included in one standard cell. The target circuit and the bias circuit 210 may be provided as one circuit.

In an embodiment, the target circuit including the tolerant element may be a circuit that operates at the first power voltage VDDH or a higher power voltage, and a maximum voltage that each of elements included in the target circuit can withstand may be lower than a power voltage input to the target circuit. Therefore, to prevent damage to the elements included in the target circuit, at least one element among the elements included in the target circuit may operate as a tolerant element.

Figure 6:
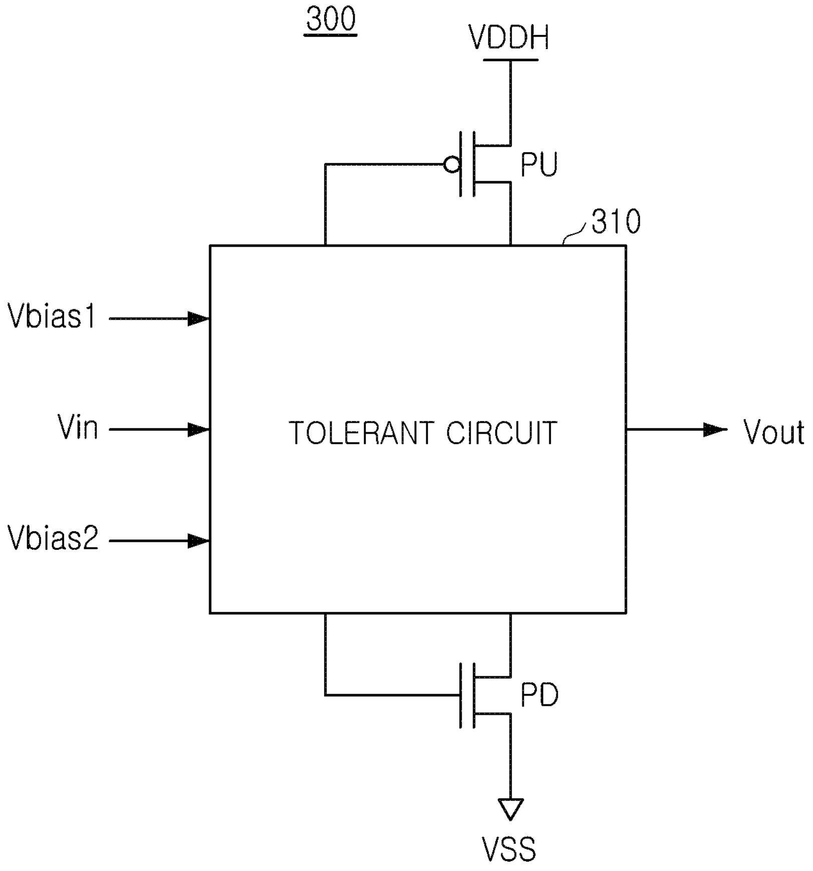
FIGS. 6 to 8 are views illustrating a semiconductor device according to an embodiment.
Figure 7:
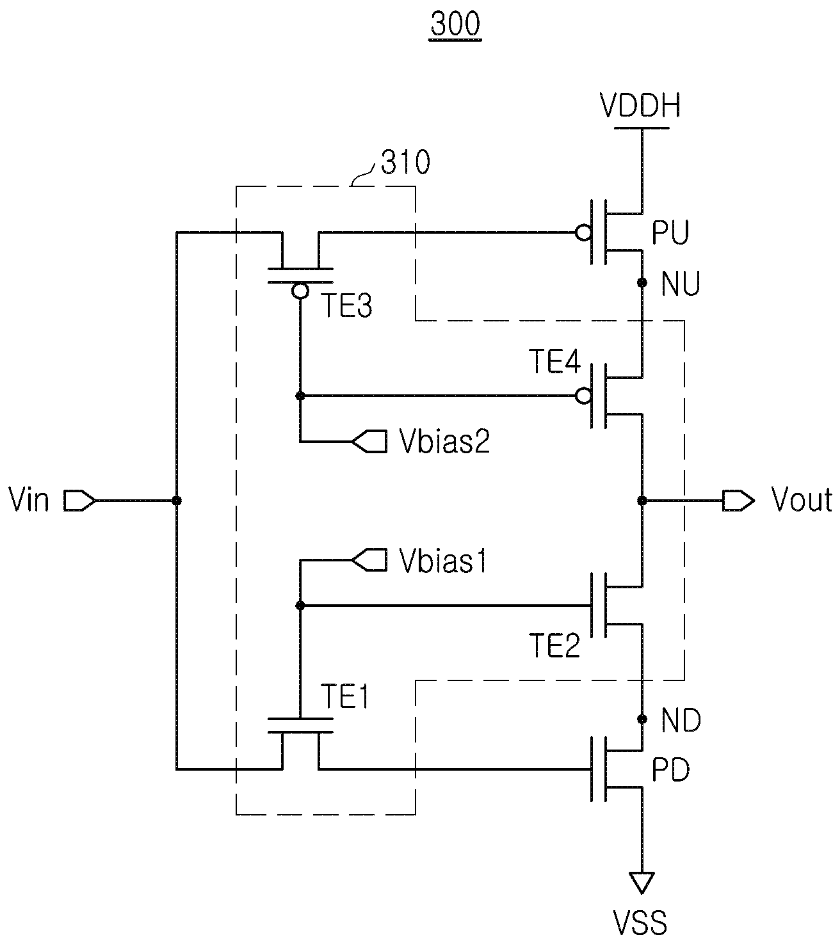
Figure 8:
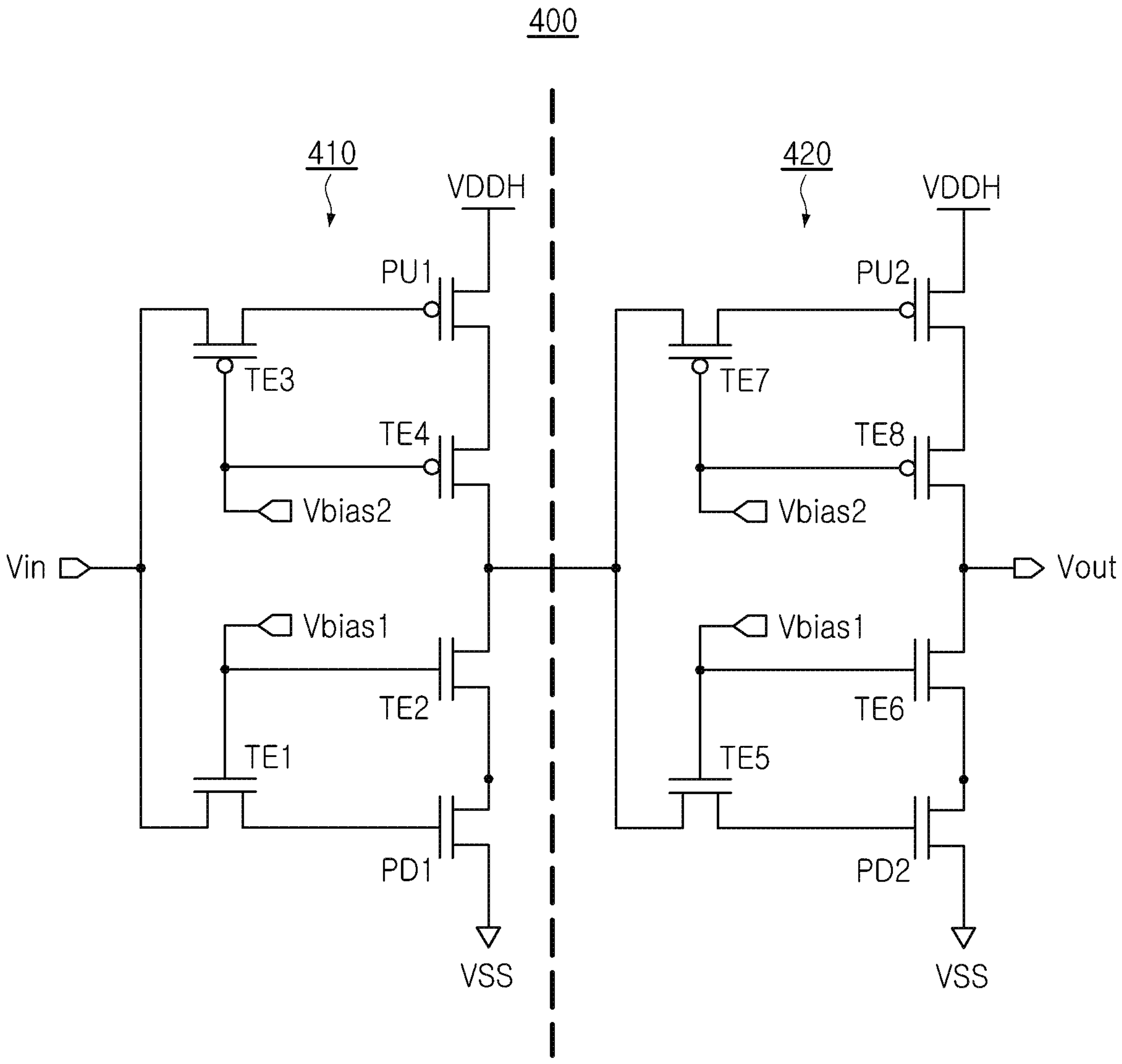

FIGS. 6 to 8 are views illustrating a semiconductor device according to an embodiment.

FIGS. 6 to 8 are views illustrating a target circuit including at least one tolerant element that may be disposed in a core region together with a bias circuit and operates by receiving bias voltages Vbias1 and Vbias2 output by the bias circuit, in a semiconductor device according to an embodiment.

First, in an embodiment illustrated in FIG. 6, a target circuit 300 may be an inverter circuit. The target circuit 300 may be a high voltage inverter that operates by receiving the first power voltage VDDH, greater than a maximum voltage that each of elements included in the target circuit 300 can withstand.

In general, the inverter circuit may be implemented with a pull-up element PU and a pull-down element PD. The target circuit 300 according to an embodiment illustrated in FIG. 6 operates with the first power voltage VDDH, greater than the maximum voltage that can be applied to each of the pull-up element PU and the pull-down element PD, and therefore may include a tolerant circuit 310 to prevent circuit damage.

Referring to FIG. 6, the tolerant circuit 310 may be connected between the pull-up element PU and the pull-down element PD, and in addition to the bias voltages Vbias1 and Vbias2, an input voltage Vin may be input to the tolerant circuit 310. In addition, an output voltage Vout may be output through a node in the tolerant circuit 310.

FIG. 7 is an example circuit diagram of a target circuit 300 including a tolerant circuit 310. Referring to FIG. 7, a first tolerant element TE1 and a second tolerant element TE2 may be connected to a pull-down element PD which may be an NMOS transistor, and a third tolerant element TE3 and a fourth tolerant element TE4 may be connected to a pull-up element PU which may be a PMOS transistor. Each of the first tolerant element TE1 and the second tolerant element TE2 may be an NMOS transistor, like the pull-down element PD, and each of the third tolerant element TE3 and the fourth tolerant element TE4 may be a PMOS transistor, like the pull-up element PU.

An input voltage Vin may be input to a node between the first tolerant element TE1 and the third tolerant element TE3, and an output voltage VOUT may be output from a node between the second tolerant element TE2 and the fourth tolerant element TE4. A first bias voltage Vbias1 may be input to a gate of the first tolerant element TE1 and a gate of the second tolerant element TE2, and a second bias voltage Vbias2 may be input to a gate of the third tolerant element TE3 and a gate of the fourth tolerant element TE4.

For example, the first bias voltage Vbias1 and the second bias voltage Vbias2 may be generated in a bias circuit 210, as described above with reference to FIG. 5. In a state in which a level of the input voltage Vin is equal to a level of the first power voltage VDDH, the first tolerant element TE1 and the third tolerant element TE3 may be turned on, and the third tolerant element TE3 may be turned on. For example, when the $V_{GS}$ of the third tolerant element TE3 corresponding to a value of $V_G$ (Vbias2)−$V_S$ (e.g., VDDH) is more negative than the threshold voltage of the third tolerant element TE3, the third tolerant element TE3 turns on and transfers the input voltage Vin of the first power voltage VDDH to the gate of the pull-up element PU. The level of the second bias voltage Vbias2 may be set to have a value sufficient to turn on the third tolerant element TE3 when receiving the input voltage Vin of the first power voltage VDDH. Therefore, the pull-up element PU receiving the input voltage Vin of the first power voltage VDDH through the third tolerant element TE3 may be turned off, the pull-down element PD receiving the input voltage Vin of the first power voltage VDDH through the first tolerant element TE1 may be turned on, a voltage of a pull-up node NU may be set to have a level, equal to a level of the second bias voltage Vbias2, and a voltage of a pull-down node ND may be set as the reference voltage VSS.

Since the first bias voltage Vbias1 is input to the gate of the second tolerant element TE2, the second tolerant element TE2 may be turned on, and the output voltage Vout may be set as the reference voltage VSS. The fourth tolerant element TE4 may also be turned on.

In a state in which the level of the input voltage Vin is equal to a level of the reference voltage VSS, the first tolerant element TE1 and the third tolerant element TE3 (when the gate of the pull-up element PU is set to have the first power voltage VDDH in the previous operation) may be turned on. Therefore, the pull-down element PD may be turned off and the pull-up element PD may be turned on, such that the voltage of the pull-up node NU may be set as the first power voltage VDDH, and the voltage of the pull-down node ND may be set as the first bias voltage Vbias1. Since the first bias voltage Vbias1 is input to the gate of the second tolerant element TE2, the second tolerant element TE2 and the fourth tolerant element TE4 may be turned on. For example, the fourth tolerant element TE4 may be turned on by the second bias voltage Vbias2 input to the gate. For example, when the $V_{GS}$ of the fourth tolerant element TE4 corresponding to a value of $V_G$ (Vbias2)−$V_S$ (e.g., VDDH at the pull-up node NU) is more negative than the threshold voltage of the fourth tolerant element TE4, the fourth tolerant element TE4 turns on and transfers the voltage of the pull-up node NU to a node outputting the output voltage Vout. Therefore, the first power voltage VDDH may be output as the output voltage Vout.

As described above, the tolerant circuit 310 may be connected between the pull-up element PU and the pull-down element PD, such that a maximum voltage applied to each of elements included in the target circuit 300 may be limited to a voltage less than the first power voltage VDDH.

Therefore, by using elements of the same specifications formed in processes of the same scales, the target circuit 300 that operates with the power voltage VDDH, greater than a maximum voltage that an element can withstand, may be implemented.

Next, in an embodiment illustrated in FIG. 8, a target circuit 400 may be a buffer circuit including a first inverter 410 and a second inverter 420. The target circuit 400 may be a high voltage buffer that operates by receiving the first power voltage VDDH, greater than a maximum voltage that each element included in the target circuit 400 can withstand.

Each of the first inverter 410 and the second inverter 420 may include pull-up elements PU1 and PU2 and pull-down elements PD1 and PD2. In addition, each of the first inverter 410 and the second inverter 420 may be additionally provided with a plurality of tolerant elements TE1 to TE8 for the purpose of limiting the maximum voltage applied to the elements. Referring to FIG. 8, in the first inverter 410, first to fourth tolerant elements TE1 to TE4 may be connected between a first pull-up element PU1 and a first pull-down element PD1, and in the second inverter 420, fifth to eighth tolerant elements TE5 to TE8 may be connected between a second pull-up element PU2 and a second pull-down element PD2.

An operation of each of the first inverter 410 and the second inverter 420 may be as described above with reference to FIG. 7. In a state in which a level of an input voltage Vin is equal to a level of the first power voltage VDDH, the pull-up element PU may be turned off and the pull-down element PD may be turned on, and the first inverter 410 may output the reference voltage VSS to the second inverter 420. In the second inverter 420, the pull-up element PU may be turned on and the pull-down element PD may be turned off, and the second inverter 420 may output the first power voltage VDDH as an output voltage Vout.

FIGS. 9, 10A, 10B, and 10C are views illustrating a semiconductor device according to an embodiment.

Figure 9:
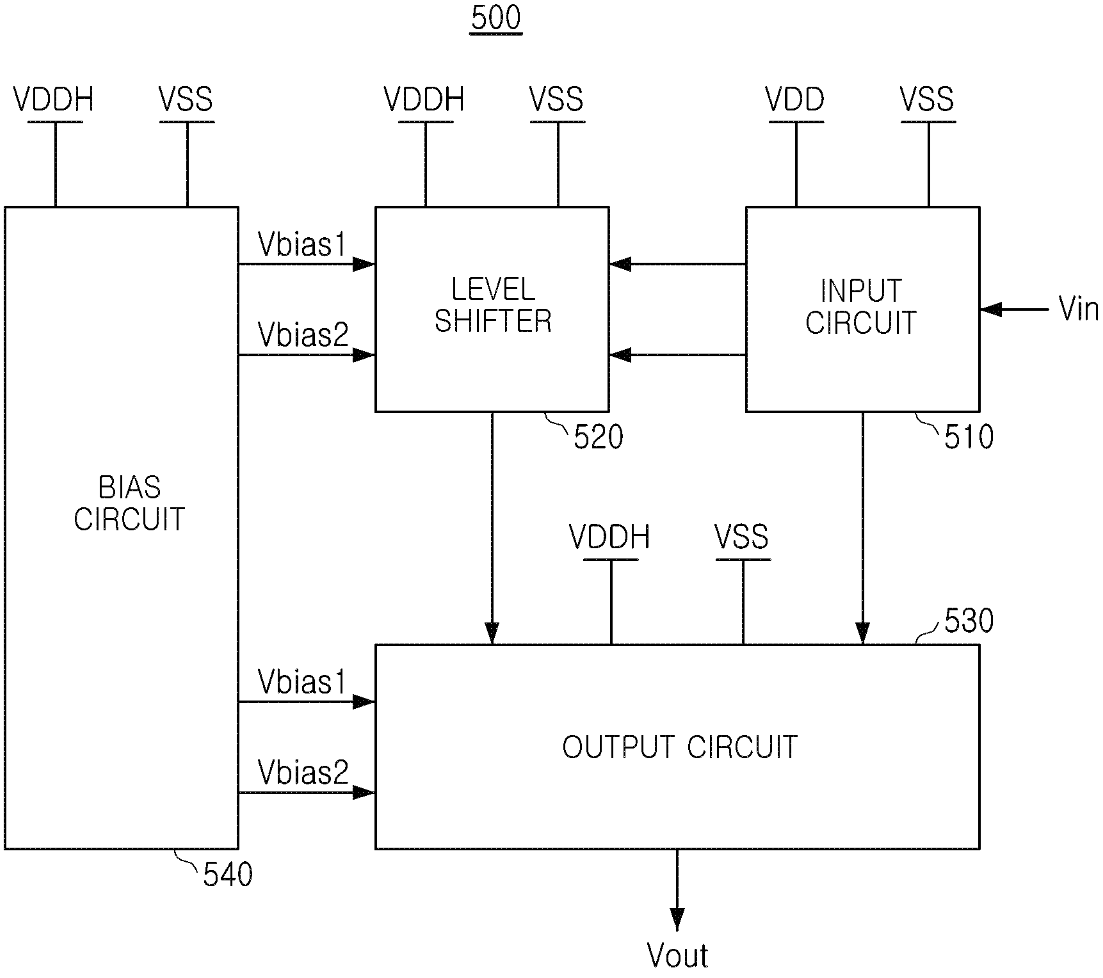
FIGS. 9, 10A, 10B, and 10C are views illustrating a semiconductor device according to an embodiment.

Referring to FIG. 9, a semiconductor device 500 according to an embodiment may include an input circuit 510, a level shifter 520, an output circuit 530, a bias circuit 540, and the like. An input voltage Vin may be input to the input circuit 510, the output circuit 530 may output an output voltage Vout, and each of the input circuit 510, the level shifter 520, and the output circuit 530 may include a plurality of elements.

In an embodiment illustrated in FIG. 9, the level shifter 520 and the output circuit 530 may operate with the first power voltage VDDH and the reference voltage VSS, while the input circuit 510 may operate with a second power voltage VDD and the reference voltage VSS. The second power voltage VDD may be a voltage, lower than the first power voltage VDDH.

Elements included in each of the input circuit 510, the level shifter 520, and the output circuit 530 may be manufactured in the same process, and may have the same specifications, and for example, a maximum voltage that one element can withstand may be the same in each of the input circuit 510, the level shifter 520, and the output circuit 530. Therefore, at least one tolerant element may be included in each of the level shifter 520 and the output circuit 530 that operate with the first power voltage VDDH having a relatively high value for the purpose of preventing damage to the elements. In an embodiment, a maximum voltage that elements included in each of the input circuit 510, the level shifter 520, and the output circuit 530 can withstand may be equal to the second power voltage VDD, or may be greater than the second power voltage VDD and less than the first power voltage VDDH.

The bias circuit 540 may operate with the first power voltage VDDH and the reference voltage VSS, and may generate a first bias voltage Vbias1 and a second bias voltage Vbias2. The first bias voltage Vbias1 and the second bias voltage Vbias2 may be bias voltages input to tolerant elements included in the level shifter 520 and the output circuit 530. The first bias voltage Vbias1 may be a voltage input to a tolerant element implemented with an NMOS transistor, and the second bias voltage Vbias2 may be a voltage input to a tolerant element implemented with a PMOS transistor. The first bias voltage Vbias1 may be greater than the second bias voltage Vbias2. An operation and a configuration of the bias circuit 540 may be similar to those described above with reference to FIG. 5.

Hereinafter, the operation and configuration of the semiconductor device 500 will be described in more detail with reference to FIGS. 10A to 10C.

Figure 10A:
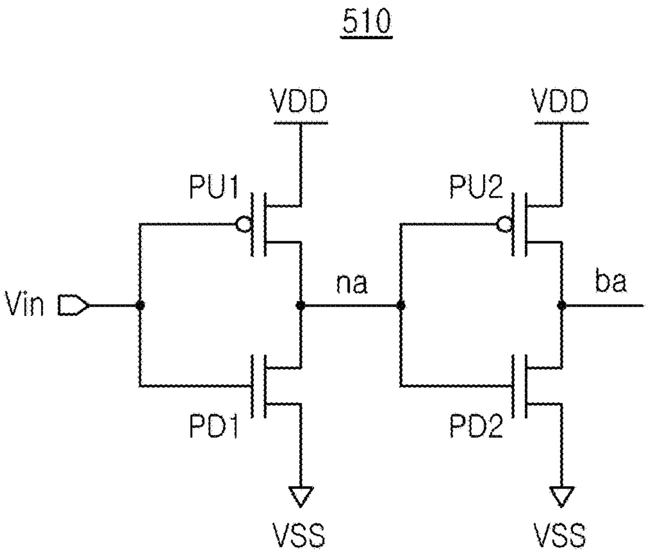

FIG. 10A may be a circuit diagram illustrating an example configuration of an input circuit 510. Referring to FIG. 10A, an input circuit 510 may be a buffer circuit, and may include a first inverter including a first pull-up element PU1 and a first pull-down element PD1, and a second inverter including a second pull-up element PU2 and a second pull-down element PD2. Each of the pull-up elements PU1 and PU2 may be connected to a second power node supplying a second power voltage VDD, and the pull-down elements PD1 and PD2 may be connected to a reference node supplying the reference voltage VSS.

The first inverter may receive an input voltage Vin and output a first input voltage na, and the second inverter may output a second input voltage ba. In an embodiment, a maximum voltage that each of the pull-up elements PU1 and PU2 and the pull-down elements PD1 and PD2 can withstand may be smaller than a difference between the second power voltage VDD and the reference voltage VSS. Therefore, the input circuit 510 may not include a tolerant element.

Figure 10B:
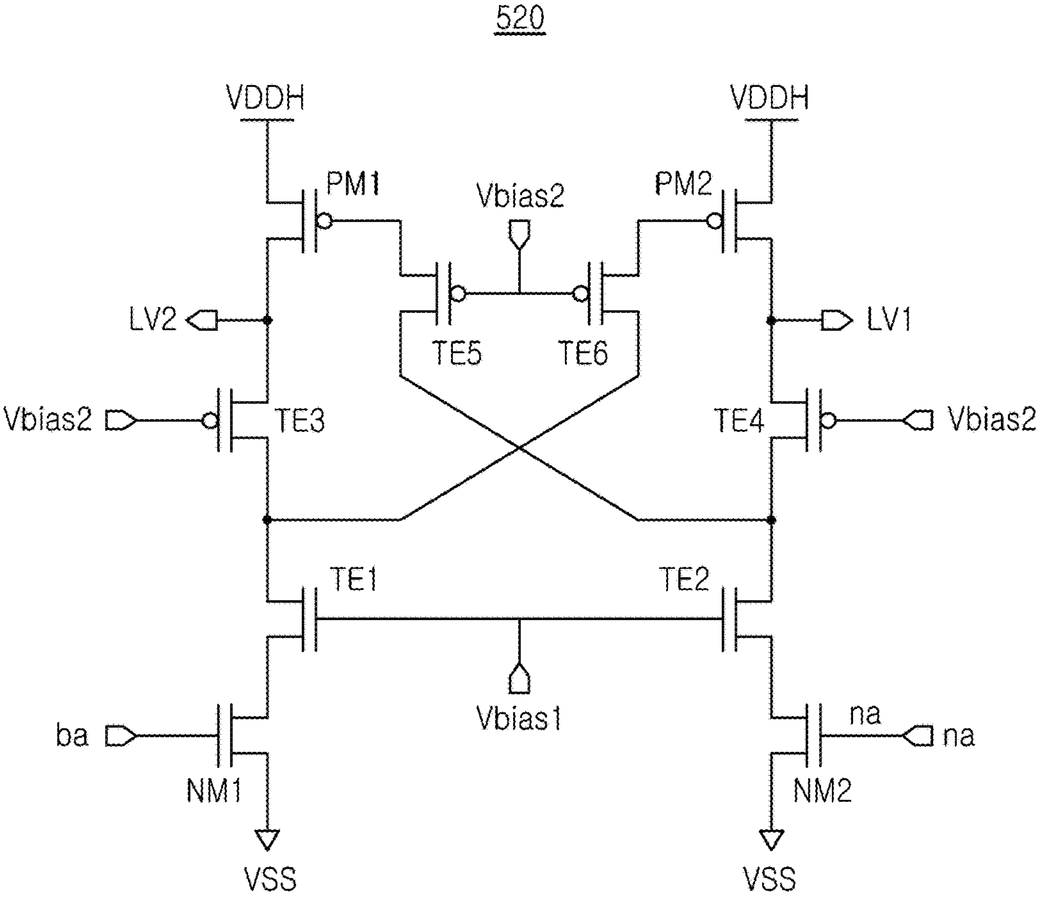

FIG. 10B may be a circuit diagram illustrating an example configuration of a level shifter 520. Referring to FIG. 10B, a level shifter 520 may include PMOS transistors PM1 and PM2 and NMOS transistors NM1 and NM2, and may also include a plurality of tolerant elements TE1 to TE6 operating with a first bias voltage Vbias1 or a second bias voltage Vbias2.

The level shifter 520 may operate with the first power voltage VDDH, greater than a second power voltage VDD and the reference voltage VSS, and a difference between the first power voltage VDDH and the reference voltage VSS may be greater than a maximum voltage that each of elements included in the level shifter 520 can withstand. As illustrated in FIG. 10B, by adding the plurality of tolerant elements TE1 to TE6, the level shifter 520 that operates with the first power voltage VDDH and the reference voltage VSS may be implemented using only elements having the same specifications without an element having a greater maximum voltage that can withstand.

Each of the first tolerant element TE1 and the second tolerant element TE2 may be implemented as an NMOS transistor, and a gate of each thereof may receive a first bias voltage Vbias1. Each of third to sixth tolerant elements TE3 to TE6 may be implemented as a PMOS transistor, and a gate of each thereof may receive a second bias voltage Vbias2. A first tolerant element TE1 and a third tolerant element TE3 may be connected between a first NMOS transistor NM1 and a first PMOS transistor PM1, and a second tolerant element TE2 and a fourth tolerant element TE4 may be connected between a second NMOS transistor NM2 and a second PMOS transistor PM2.

A node between the first tolerant element TE1 and the third tolerant element TE3 may be connected to a sixth tolerant element TE6, and a node between the second tolerant element TE2 and the fourth tolerant element TE4 may be connected to a fifth tolerant element TE5. The fifth tolerant element TE5 may be connected to a gate of the first PMOS transistor PM1, the sixth tolerant element TE6 may be connected to a gate of the second PMOS transistor PM2, and a gate of the fifth tolerant element TE5 may be connected to a gate of the sixth tolerant element TE6.

Hereinafter, an operation of the level shifter 520 will be described.

Referring to FIG. 10B, a second input voltage ba may be input to a gate of the first NMOS transistor NM1, and a first input voltage na may be input to a gate of the second NMOS transistor NM2. Therefore, when one of the first NMOS transistor NM1 and the second NMOS transistor NM2 is turned on, the other may be turned off.

When the first NMOS transistor NM1 is turned on and the second NMOS transistor NM2 is turned off, the first tolerant element TE1 and the second tolerant element TE2 may be turned on. Therefore, a voltage of the node between the first tolerant element TE1 and the third tolerant element TE3 may be set as the reference voltage VSS, and the third tolerant element TE3 and the sixth tolerant element TE6 may be turned on. A voltage of the node between the second tolerant element TE2 and the fourth tolerant element TE4 may rise up to a voltage, higher than the reference voltage VSS, and the fourth tolerant element TE4 and the fifth tolerant element TE5 may be turned on. As the fifth tolerant element TE5 and the sixth tolerant element TE6 are turned on, a first voltage LV1 may be output to be greater than a second voltage LV2. When the first NMOS transistor NM1 is turned off and the second NMOS transistor NM2 is turned on, the second voltage LV2 may be output to be greater than the first voltage LV1.

Figure 10C:
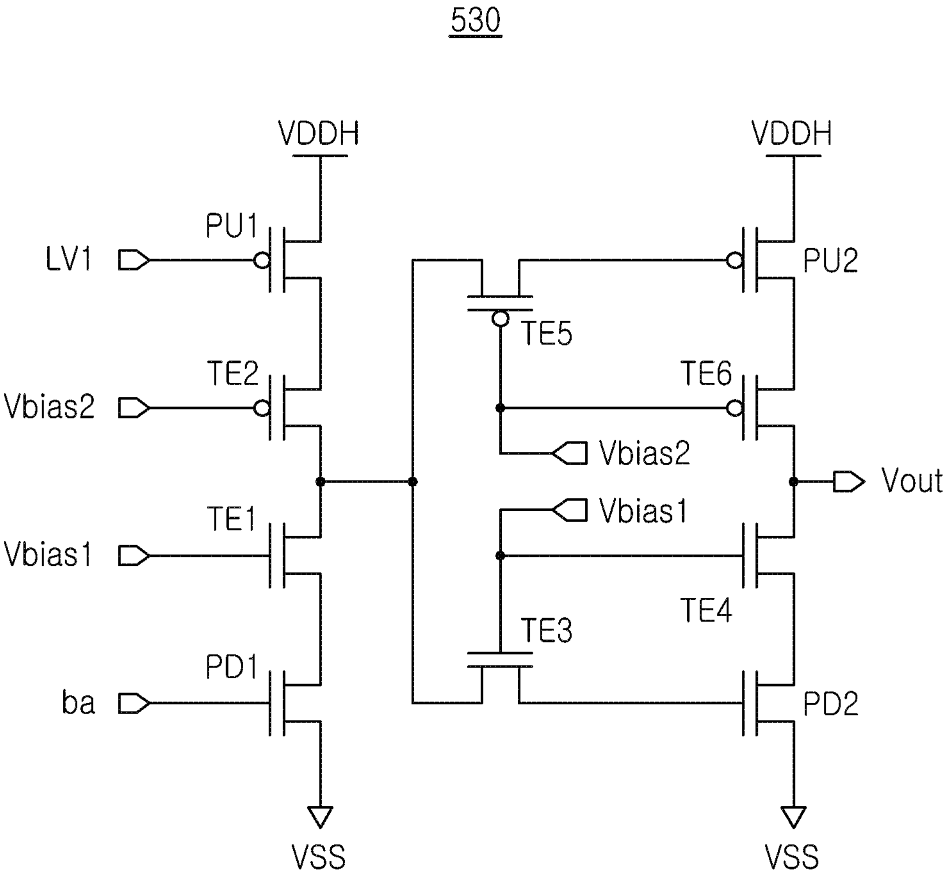

FIG. 10C may be a circuit diagram illustrating an example configuration of an output circuit 530. Referring to FIG. 10C, an output circuit 530 may be a buffer circuit, and may include a plurality of pull-up elements PU1 and PU2, a plurality of pull-down elements PD1 and PD2, and a plurality of tolerant elements TE1 to TE6. The plurality of pull-up elements PU1 and PU2 may be connected to a first power node supplying the first power voltage VDDH, and the plurality of pull-down elements PD1 and PD2 may be connected to a reference node supplying the reference voltage VSS.

The first voltage LV1 output by a level shifter 520 may be input to a gate of a first pull-up element PU1, and a second input voltage ba output by an input circuit 510 may be input to a gate of a first pull-down element PD1. A first bias voltage Vbias1 may be input to a gate of a first tolerant element TE1, and a second bias voltage Vbias2 may be input to a gate of a second tolerant element TE2.

As described above, the second input voltage ba may be a second power voltage VDD or the reference voltage VSS, and if the second input voltage ba may be the second power voltage VDD, the first voltage LV1 may have a level, equal to a level of the second power voltage VDD. Therefore, when an input voltage Vin received by the input circuit 510 is the second power voltage VDD, the first pull-down element PD1 and the first tolerant element TE1 may be turned on such that the reference voltage VSS may be input to a third tolerant element TE3 and a fifth tolerant element TE5. When the input voltage Vin is the reference voltage VSS, the first pull-up element PU1 and the second tolerant element TE2 may be turned on such that a first power voltage VDDH may be input to the third tolerant element TE3 and the fifth tolerant element TE5.

A circuit including the second pull-up element PU2, the second pull-down element PD2, and the third to sixth tolerant elements TE3 to TE6 may be an inverter circuit, as described above with reference to FIG. 7. Therefore, when the input voltage Vin is the second power voltage VDD, the output circuit 530 may output the first power voltage VDDH, and when the input voltage Vin is the reference voltage VSS, the output circuit 530 may output the reference voltage VSS.

As a result, the input circuit 510, the level shifter 520, and the output circuit 530 may provide a high-voltage level shifter that level-shifts an input voltage Vin having a level between the second power voltage VDD and the reference voltage VSS to an output voltage Vout having a level between the first power voltage VDDH and the reference voltage VSS, and outputs the same. A bias circuit 540 may generate the bias voltages Vbias1 and Vbias2 required for operations of tolerant elements included in the high-voltage level shifter, which may be a target circuit.

Elements included in the bias circuit 540 may be elements produced in a process of the same scale as elements included in each of the input circuit 510, the level shifter 520, and the output circuit 530, described with reference to FIGS. 10A to 10C. Therefore, the bias circuit 540 may be disposed adjacent to the high-voltage level shifter, and a transmission path of the bias voltages Vbias1 and Vbias2 may be shortened to reduce influence of leakage characteristics and resistance, and improve a degree of integration of a semiconductor device 500. According to an embodiment, the high-voltage level shifter and the bias circuit 540 may be disposed in a macro area divided into a plurality of finishing cells, and provided as one macro cell.

FIGS. 11, 12A, 12B, 12C, and 12D are views illustrating a semiconductor device according to an embodiment.

Figure 11:
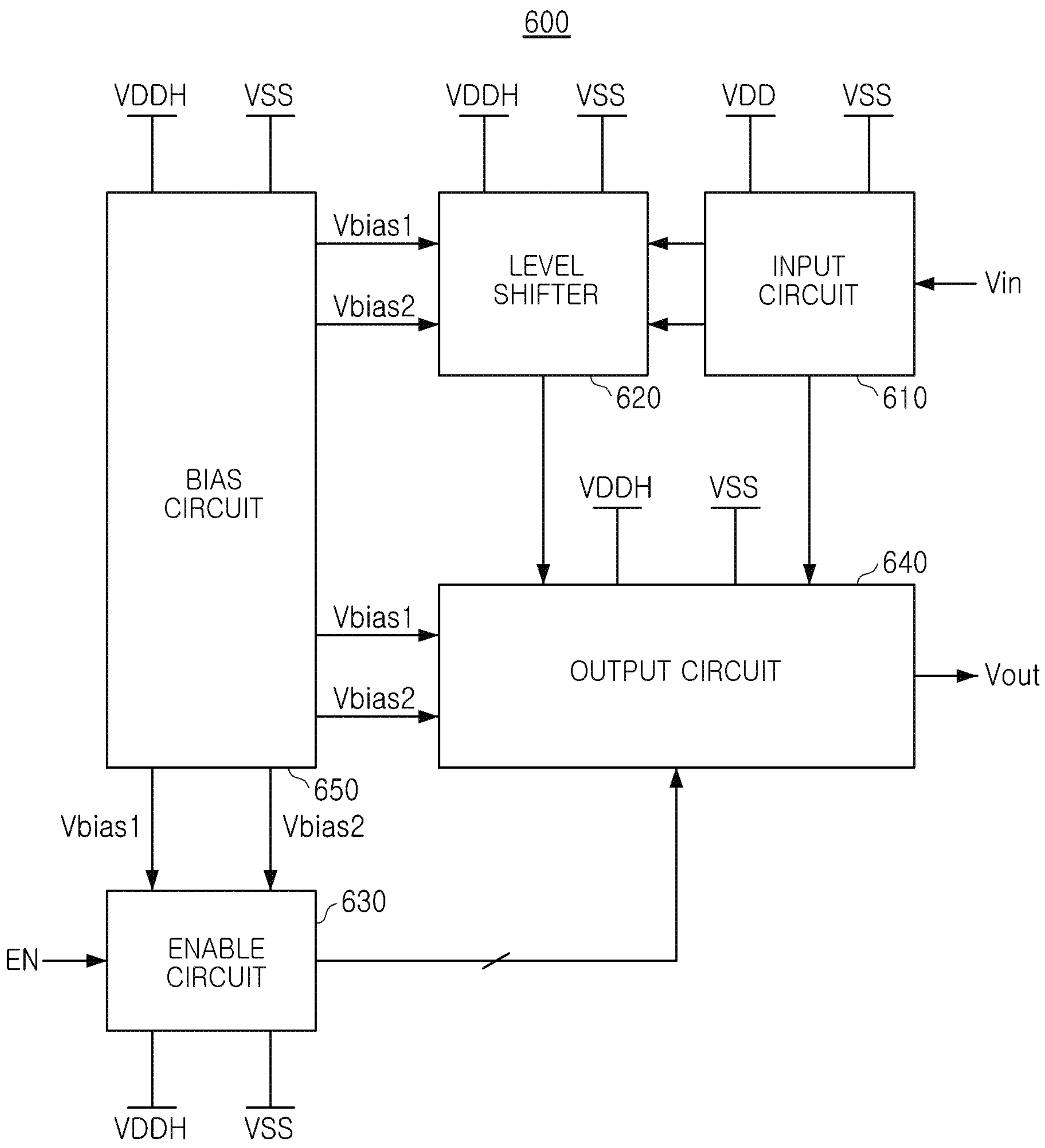
FIGS. 11, 12A, 12B, 12C, and 12D are views illustrating a semiconductor device according to an embodiment.

Referring to FIG. 11, a semiconductor device 600 according to an embodiment may include an input circuit 610, a level shifter 620, an enable circuit 630, an output circuit 640, a bias circuit 650, and the like. An input voltage Vin may be input to the input circuit 610, the output circuit 640 may output an output voltage Vout, and the enable circuit 630 may control an operation of the output circuit 640 in response to an enable signal EN.

In an embodiment illustrated in FIG. 11, the level shifter 620, the enable circuit 630, and the output circuit 640 may operate with the first power voltage VDDH and the reference voltage VSS, while the input circuit 610 may operate with a second power voltage VDD and the reference voltage VSS. The second power voltage VDD may be a voltage, lower than the first power voltage VDDH.

Elements included in each of the input circuit 610, the level shifter 620, the enable circuit 630, and the output circuit 640 may be manufactured in the same process, and may have the same specifications. For example, a maximum voltage that can be applied to one element may be the same in each of the input circuit 610, the level shifter 620, the enable circuit 630, and the output circuit 640. Therefore, when the first power voltage VDDH having a relatively high value is directly applied to the elements included in each of the level shifter 620, the enable circuit 630, and the output circuit 640, the elements may be damaged. To prevent this, each of the level shifter 620, the enable circuit 630, and the output circuit 640 may include at least one tolerant element.

The bias circuit 650 may operate with the first power voltage VDDH and the reference voltage VSS, and may generate a first bias voltage Vbias1 and a second bias voltage Vbias2. The first bias voltage Vbias1 may be a voltage input to a tolerant element implemented with an NMOS transistor, and the second bias voltage Vbias2 may be a voltage input to a tolerant element implemented with a PMOS transistor. An operation and a configuration of the bias circuit 650 may be similar to those described above with reference to FIG. 5.

Hereinafter, the operation and configuration of the semiconductor device 600 will be described in more detail with reference to FIGS. 12A to 12D.

Figure 12A:
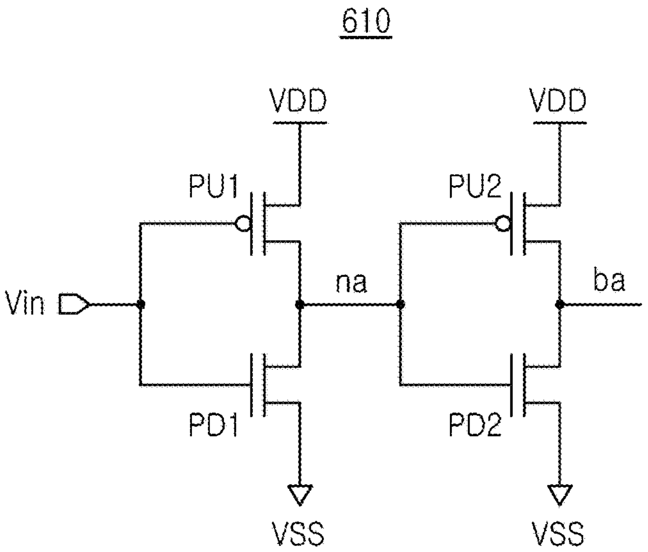

FIG. 12A may be a circuit diagram illustrating an example configuration of an input circuit 610. Referring to FIG. 12A, an input circuit 610 may be a buffer circuit, and a configuration and an operation thereof may be similar to those described above with reference to FIG. 10A. For example, an input circuit 610 may include a first inverter including a first pull-up element PU1 and a first pull-down element PD1, and a second inverter including a second pull-up element PU2 and a second pull-down element PD2. The first inverter may receive an input voltage Vin, and may output a first input voltage na, and the second inverter may output a second input voltage ba.

Figure 12B:
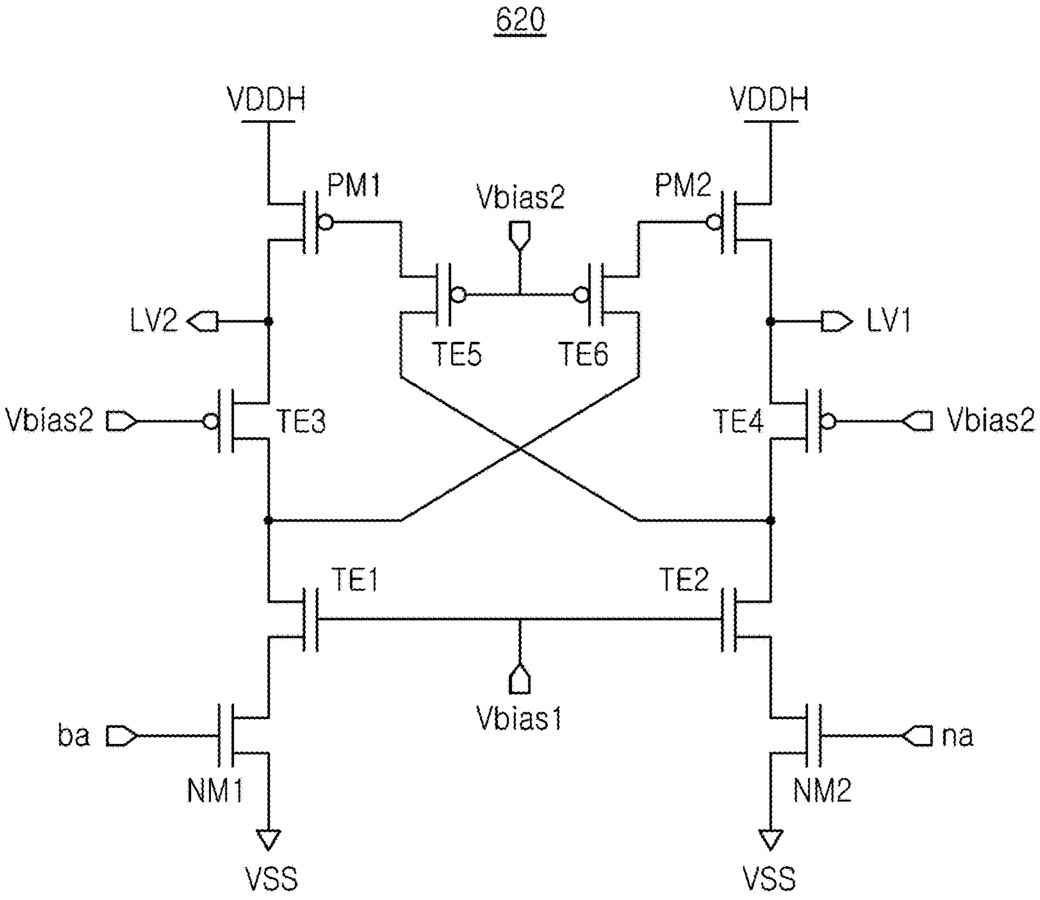

FIG. 12B may be a circuit diagram illustrating an example configuration of a level shifter 620. Referring to FIG. 12B, a level shifter 620 may include PMOS transistors PM1 and PM2 and NMOS transistors NM1 and NM2, and may also include a plurality of tolerant elements TE1 to TE6 operating with a first bias voltage Vbias1 or a second bias voltage Vbias2. An operation and a configuration of the level shifter 620 may be similar to those described above with reference to FIG. 10B.

A first NMOS transistor NM1 and a second NMOS transistor NM2 may be selectively turned on. When the first NMOS transistor NM1 is turned on, the second NMOS transistor NM2 may be turned off, and a first tolerant element TE1, a fourth tolerant element TE4, and a fifth tolerant element TE5 may be turned on. Therefore, the first voltage LV1 may be output to be greater than the second voltage LV2. When the first NMOS transistor NM1 is turned off, the second voltage LV2 may be output to be greater than the first voltage LV1.

Figure 12C:
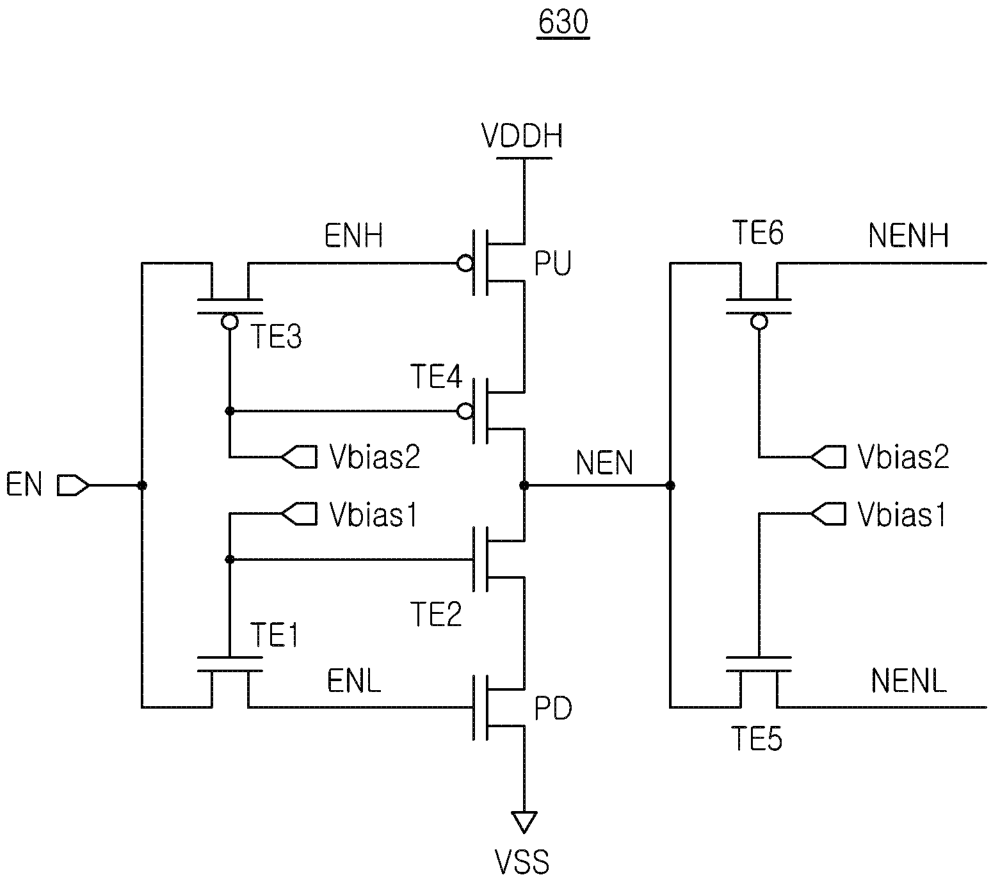

FIG. 12C may be a circuit diagram illustrating an example configuration of the enable circuit 630. Referring to FIG. 12C, the enable circuit 630 may include a pull-up element PU, a pull-down element PD, and first to sixth tolerant elements TE1 to TE6. The pull-up element PU, the pull-down element PD, and the first to fourth tolerant elements TE1 to TE4 may provide an inverter circuit.

An enable signal EN may be input to the inverter circuit, and the inverter circuit may output an inverted enable signal NEN. The inverted enable signal NEN may be input to each of the fifth tolerant element TE5 and the sixth tolerant element TE6, and the fifth tolerant element TE5 may output a first inverted enable signal NENL, and the sixth tolerant element TE6 may output a second inverted enable signal NENH.

In the inverter circuit included in the enable circuit 630, a first enable signal ENL may be determined as a voltage of a gate of the pull-down element PD, and a second enable signal ENH may be determined as a voltage of a gate of the pull-up element PU. For example, the first enable signal ENL is supplied to the gate of the pull-down element PD, and the second enable signal ENH is supplied to the gate of the pull-up element PU. An operation of an output circuit 640 may be controlled by the first enable signal ENL, the second enable signal ENH, the first inverted enable signal NENL, and the second inverted enable signal NENH.

Figure 12D:
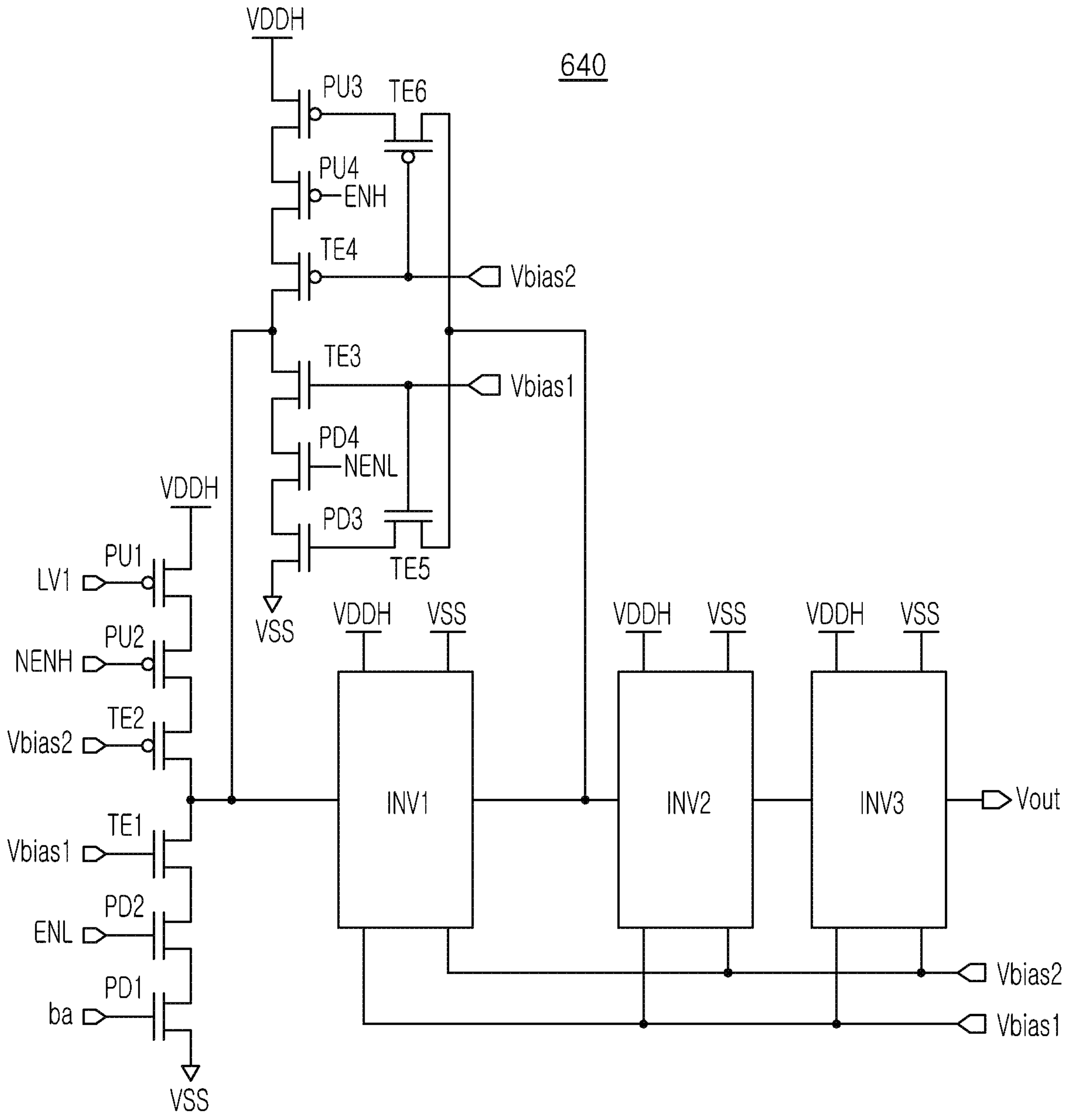

FIG. 12D may be a circuit diagram illustrating an example configuration of an output circuit 640. Referring to FIG. 12D, an output circuit 640 may include a plurality of pull-up elements PU1 to PU4, a plurality of pull-down elements PD1 to PD4, a plurality of tolerant elements TE1 to TE6, a plurality of inverters INV1 to INV3, and the like. Each of the plurality of inverters INV1 to INV3 may include a pull-up element, a pull-down element, and a tolerant element, as described above with reference to FIG. 7, and may operate with the first power voltage VDDH and the reference voltage VSS.

In an embodiment illustrated in FIG. 12D, a first pull-up element PU1 may be controlled by the first voltage LV1 output by a level shifter 620, and a second pull-up element PU2 may be controlled by a second inverted enable signal NENH output by the enable circuit 630. A first pull-down element PD1 may be controlled by a second input voltage ba, and a second pull-down element PD2 may be controlled by a first enable signal ENL. A fourth pull-up element PU4 may be controlled by a second enable signal ENH, and a fourth pull-down element PD4 may be controlled by a first inverted enable signal NENL.

The output circuit 640 may change an output voltage Vout by a plurality of signals (ENL, ENH, NENL, and NENH) output by the enable circuit 630. For example, when an enable signal EN input to the enable circuit 630 is 0, the output circuit 640 may maintain the output voltage Vout without changing the same regardless of a change in input voltage Vin. When the enable signal EN is 1, the output circuit 640 may output the first power voltage VDDH as an output voltage Vout when the input voltage Vin is a second power voltage VDD, and may output the reference voltage VSS as an output voltage Vout when the input voltage Vin is the reference voltage VSS.

As a result, an input circuit 610, a level shifter 620, the enable circuit 630, and the output circuit 640 may provide a latch type high-voltage level shifter controlled according to the enable signal EN to level-shift the input voltage Vin to output the output voltage Vout. A bias circuit 650 may generate bias voltages Vbias1 and Vbias2 which are supplied to tolerant elements included in a high-voltage level shifter, which is a target circuit.

Elements included in the bias circuit 650 may be elements produced in a process of the same scale as elements included in each of the input circuit 610, the level shifter 620, the enable circuit 630, and the output circuit 640 described with reference to FIGS. 12A to 12D. Therefore, the bias circuit 650 may be disposed adjacent to the latch type high-voltage level shifter, and may shorten a transmission path of the bias voltages Vbias1 and Vbias2 to reduce influence of leakage characteristics and resistance, and improve a degree of integration of the semiconductor device 600. According to an embodiment, the latch type high-voltage level shifter and the bias circuit 650 may be finished with a plurality of finishing cells and provided as one macro cell.

According to an embodiment, a circuit that operates at a power voltage, higher than a limited voltage, may be implemented using only elements having a lower limited voltage, which is a maximum voltage that can be applied, and a bias circuit that supplies a bias voltage to some of elements included in a circuit may also be implemented using elements having the same limited voltage. Therefore, a bias circuit and a circuit that operates by receiving a bias voltage from the bias circuit may be implemented in a region of the same voltage domain in a semiconductor device, and a degree of integration or leakage characteristics of the semiconductor device may be improved. In addition, by implementing both the bias circuit and the circuit that receives the bias voltage from the bias circuit with only the elements having the same limited voltage, the process may be simplified.

Various advantages and effects of the present inventive concept are not limited to the above-described contents, and will be more easily understood in the process of explaining specific embodiments.

While example embodiments have been illustrated and described above, it will be apparent to those skilled in the art that modifications and variations could be made without departing from the scope of the present inventive concept as defined by the appended claims.

What is claimed is:

1. A semiconductor device comprising a bias voltage generation circuit generating a plurality of bias voltages,
wherein the bias voltage generation circuit includes:
a plurality of transistors connected in series between a first power node supplying a first power voltage and a reference node supplying a reference voltage, lower than the first power voltage;
a plurality of capacitors connected to some transistors among the plurality of transistors, wherein each of the plurality of capacitors is connected in parallel with a corresponding transistor of the some transistors; and
a turn-on circuit configured to supply a turn-on voltage to a gate of a first transistor among the plurality of transistors,
wherein each of the turn-on circuit and the first transistor is directly connected to the first power node, and
wherein each of the plurality of transistors has a gate and a drain, electrically connected to each other.

2. The semiconductor device of claim 1,
wherein the plurality of transistors further comprise a second transistor, a third transistor, a fourth transistor, a fifth transistor, and a sixth transistor, connected in series to the first transistor.

3. The semiconductor device of claim 2,
wherein the plurality of bias voltages include:
a first bias voltage outputted from a first node between the second transistor and the third transistor; and
a second bias voltage outputted from a second node between the fourth transistor and the fifth transistor, and
wherein the first bias voltage is greater than the second bias voltage.

4. The semiconductor device of claim 3,
wherein the turn-on circuit comprises:
a first PMOS transistor connected to the first power node and a gate of the first transistor,
a first NMOS transistor connected to the reference node, and
a second PMOS transistor connected between a gate of the first PMOS transistor and the first NMOS transistor,
wherein a gate of the first NMOS transistor receives the first bias voltage, and
wherein a gate of the second PMOS transistor receives the second bias voltage.

5. The semiconductor device of claim 1,
wherein each of the plurality of capacitors is a metal-oxide- semiconductor (MOS) capacitor.

6. The semiconductor device of claim 5,
wherein the plurality of capacitors include a first group of N-type MOS (NMOS) capacitors and a second group of P-type MOS (PMOS) capacitors.

7. The semiconductor device of claim 6,
wherein a number of the first group of NMOS capacitors is equal to a number of the second group of PMOS capacitors.

8. The semiconductor device of claim 6,
wherein each of the first group of NMOS capacitors and each of the second group of PMOS capacitors are alternately arranged between the first power node and the reference node.

9. The semiconductor device of claim 5,
wherein a gate of the MOS capacitor is connected to the reference node.

10. The semiconductor device of claim 1,
wherein a number of the some transistors connected to the plurality of capacitors is greater than a number of remaining transistors, not connected to the plurality of capacitors, among the plurality of transistors.

11. A semiconductor device comprising:
a bias voltage generation circuit configured to generate a first bias voltage and a second bias voltage; and
a target circuit connected to a first power node and a reference node and configured to operate by receiving a first power voltage supplied from the first power node and a reference voltage supplied from the reference node, wherein the reference voltage is smaller than the first power voltage, and wherein the target circuit includes:
a plurality of transistors of which at least one transistor is directly connected to the first power node and at least one transistor is directly connected to the reference node, and
a plurality of tolerant transistors connected to the bias voltage generation circuit, wherein each of the plurality of tolerant transistors is configured to receive a corresponding one of the first bias voltage and the second bias voltage, wherein the first bias voltage and the second bias voltage are smaller than the first power voltage and greater than the reference voltage,
wherein the bias voltage generation circuit includes a plurality of diode-connected transistors connected in series between the first power node and the reference node,
wherein the first bias voltage is output from a first node between two adjacent diode-connected transistors among the plurality of diode-connected transistors, and the second bias voltage, smaller than the first bias voltage, is output from a second node between another two adjacent diode-connected transistors among the plurality of diode-connected transistors, and
wherein a maximum voltage that can be applied to each of the plurality of diode-connected transistors is equal to a maximum voltage that can be applied to each of the plurality of transistors.

12. The semiconductor device of claim 11,
wherein a thickness of a gate insulating layer included in each of the plurality of diode-connected transistors is equal to a thickness of a gate insulating layer included in each of the plurality of transistors.

13. The semiconductor device of claim 11, wherein the at least one transistor, directly connected to the first power node, of the target circuit comprises a first P-type MOS (PMOS) transistor directly connected to the first power node, wherein the at least one transistor, directly connected to the reference node, of the target circuit comprises a second N-type MOS (NMOS) transistor directly connected to the reference node, wherein the plurality of tolerant transistors are connected to the first PMOS transistor or the second NMOS transistor, and wherein a gate of each of the plurality of tolerant transistors is configured to receive the corresponding one of the first bias voltage and the second bias voltage.

14. The semiconductor device of claim 13, wherein the plurality of tolerant transistors comprise:

a first tolerant NMOS transistor, and a second tolerant PMOS transistor, and wherein the first bias voltage is input to a gate of the first tolerant NMOS transistor, and the second bias voltage is input to a gate of the second tolerant PMOS transistor.

15. The semiconductor device of claim 11, wherein the target circuit comprises at least one of a level shifter, an inverter, and a buffer.

16. The semiconductor device of claim 11, wherein the target circuit and the bias voltage generation circuit are provided as a macro cell.

17. The semiconductor device of claim 11, wherein the bias voltage generation circuit comprises a plurality of MOS capacitors connected to some diode-connected transistors among the plurality of diode-connected transistors, wherein each of the plurality of MOS capacitors is connected in parallel with a corresponding diode-connected transistor of the plurality of diode-connected transistors, and wherein the plurality of MOS capacitors include a first group of N-type MOS capacitors and a second group of P-type MOS capacitors.

18. The semiconductor device of claim 17, wherein each of the plurality of diode-connected transistors operates as a diode.

19. The semiconductor device of claim 11, wherein a maximum voltage that can be applied to each of the plurality of transistors is lower than the first power voltage.

20. A semiconductor device comprising:

a target circuit including a plurality of elements, and connected to a first power node supplying a first power voltage and a reference node supplying a reference voltage, lower than the first power voltage; and a bias voltage generation circuit configured to output a first bias voltage and a second bias voltage, input to a gate of each of some elements among the plurality of elements, wherein the bias voltage generation circuit includes a plurality of transistors connected in series between the first power node and the reference node, and a plurality of capacitors connected to some transistors, among the plurality of transistors, connected in sequence from the reference node., and wherein, for each capacitor of the plurality of capacitors, a first electrode of the capacitor is connected to the reference node and a second electrode of the capacitor is connected to a corresponding transistor of the some transistors.

* * * * *